(12) United States Patent
Magome

(10) Patent No.: US 6,319,641 B2
(45) Date of Patent: Nov. 20, 2001

(54) SCANNING EXPOSURE METHOD UTILIZING ALIGNMENT MARKS BASED ON SCANNING DIRECTION

(75) Inventor: Nobutaka Magome, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/730,590

(22) Filed: Dec. 7, 2000

Related U.S. Application Data

(60) Continuation of application No. 09/361,247, filed on Jul. 27, 1999, now abandoned, which is a division of application No. 09/099,108, filed on Jun. 18, 1998, now Pat. No. 5,981,117, which is a continuation of application No. 08/637,160, filed on Apr. 24, 1996, now abandoned.

(30) Foreign Application Priority Data

Apr. 28, 1995 (JP) .................................................. 7-106557

(51) Int. Cl.[7] ........................................................ G03F 9/00
(52) U.S. Cl. .............................. 430/22; 430/30; 430/296; 430/397
(58) Field of Search ................................ 430/22, 30, 296, 430/397; 355/53, 77; 356/399, 401; 250/491.1

(56) References Cited

U.S. PATENT DOCUMENTS

| | | | |
|---|---|---|---|
| 4,780,617 | 10/1988 | Umatate et al. | 250/548 |
| 4,833,621 | 5/1989 | Umatate | 364/491 |
| 4,924,257 | 5/1990 | Jain | 355/53 |
| 5,194,893 | 3/1993 | Nishi | 355/53 |
| 5,525,808 | 6/1996 | Irie et al. | 250/548 |
| 5,969,800 | 10/1999 | Makinouchi | 355/53 |

*Primary Examiner*—Christopher G. Young
(74) *Attorney, Agent, or Firm*—Armstrong, Westerman, Hattori, McLeland & Naughton, LLP

(57) ABSTRACT

A mask pattern is transferred onto a wafer by exposure with a mask stage and a wafer stage being moved synchronously. In global alignment of the mask and the wafer, the scanning direction in the present (second layer) scanning exposure is made coincident with the scanning direction in the preceding (first layer) scanning exposure. When alignment is made by calculating shot array coordinates in advance, shot array coordinates are calculated for each scanning direction.

31 Claims, 7 Drawing Sheets

Fig. 2

PROCESS PROGRAM FILE (P.P.F.)

(1) FILE NAME
① ATTRIBUTE PARAMETER GROUP
② LAYER (2) RETICLE PARAMETER GROUP
① PATTERN SIZE
② MARK LAYOUT
③ WRITING ERROR (4) EXPOSURE CONDITION PARAMETER GROUP
① AMOUNT OF EXPOSURE
② BLIND
③ FOCAL POINT, MAGNIFICATION
④ LEVELING  ⑤ OFFSET (3) WAFER PARAMETER GROUP
① SHOT REGION SIZE
② SCANNING & STEPPING DIRECTION (5) ALIGNMENT PARAMETER GROUP
① SENSOR
② METHOD
③ OFFSET (6) TRANSPORT CONDITION PARAMETER GROUP
① ASIC COMPATIBLE
② SCREEN SYNTHESIS (7) ILLUMINATION CONDITION PARAMETER GROUP
① MODIFIED LIGHT SOURCE
② $\sigma$    ③ NA (8) OPTIONAL CONDITION PARAMETER GROUP
① OPTICAL EDGE BEAD REMOVER
② DP      ③ TEST
(9) ERROR LOG SETTING PARAMETER GROUP
① SYNCHRONOUS ERROR
② MISFIRE

SUBSEQUENCE SETTING SWITCH GROUP

SCANNING EXPOSURE METHOD UTILIZING ALIGNMENT MARKS BASED ON SCANNING DIRECTION

This application is a continuation of prior application Ser. No. 09/361,247, filed Jul. 27, 1999, now abandoned, which is a Division of prior application Ser. No. 09/099,108, filed Jun. 18, 1998, now U.S. pat. No. 5,981,117 which is a Continuation of prior application Ser. No. 08/637,160, filed Apr. 24, 1996 (which is now Abandoned).

BACKGROUND OF THE INVENTION

The present invention relates to a scanning exposure method and a circuit element producing method which employs the scanning exposure method. More particularly, the present invention relates to a scanning exposure method which is used in a lithography process for producing semiconductor elements such as ICs, and also relates to a circuit element producing method which employs the scanning exposure method.

Exposure systems play an important role in lithography processes for producing semiconductor elements (e.g. ICs). The mainstream of such exposure systems is known as a stepper, which forms a plurality of shot regions (i.e. pattern regions which are each formed by one exposure shot) on a wafer coated with a photosensitive material such as a resist by repeating a process in which a mask pattern is projected onto the wafer, and the wafer is stepped (stepwisely moved). Each of a plurality of shot regions formed on the wafer constitutes an individual semiconductor element as a product. Referring to one of the shot regions formed on the wafer. A plurality of masks (1 to n masks) each having a predetermined pattern written thereon are prepared, and overlay exposure is carried out a plurality (n) of times using each of the masks, thereby producing one semiconductor element. Accordingly, the photosensitive substrate has a plurality (n) of wiring layers formed thereon. More specifically, a pattern formed on a first mask (i.e. a mask for a first layer) is projected onto a photosensitive substrate coated with a resist, and then a developing process is carried out to form a first-layer pattern on the photosensitive substrate. Next, a pattern formed on a second mask (i.e. a mask for a second layer) is projected over the first-layer pattern formed on the photosensitive substrate. Then, a developing process is carried out to form a second-layer pattern on the photo sensitive substrate. Next, a pattern formed on a third mask (i.e. a mask for a third layer) is projected over the second-layer pattern formed on the photosensitive substrate, and then a developing process is carried out to form a third-layer pattern on the photosensitive substrate. By repeating such a projection and developing process n times, a semiconductor element comprising n layers is produced.

An alignment technique whereby a pattern of a mask which is used for the present exposure process is overlaid on a pattern (i.e. a pattern of a mask used in the preceding exposure process) formed on a photosensitive substrate is regarded as one of the most important techniques in lithography processes.

Alignment methods may be roughly divided into two categories: die-by-die alignment (hereinafter referred to as "D/D alignment", and global alignment.

In the D/D alignment, for each exposure shot, the position of an alignment mark provided in a previously shot region is measured with an alignment sensor, and a projected image of a mask pattern and the shot region are aligned with each other on the basis of the alignment mark.

In the global alignment, positions of alignment marks formed in a predetermined number of shot regions for alignment (i.e. sample shot regions) among a plurality of shot regions formed on a photosensitive substrate are measured with an alignment sensor, and a substrate stage having the photosensitive substrate placed thereon is moved on the basis of the result of the measurement. In the global alignment, the substrate stage needs to be accurately positioned; in the existing exposure systems, the position of the substrate stage is measured with a laser interferometer, and the movement of the substrate stage is controlled on the basis of the result of the laser interferometric measurement. The positional relationship between the alignment sensor and the mask pattern has previously been determined. Therefore, the mask pattern and the pattern (shot pattern) formed on the photosensitive substrate are indirectly aligned with each other by means of global alignment. Among the global alignment methods is an enhanced global alignment (EGA) method. In the EGA method, an array error of shot regions is obtained on the basis of positional information on several to ten sample shot regions. Then, new shot array coordinates are calculated by using a statistic computing technique, and the substrate stage is positioned according to the new shot array coordinates. The details of the EGA method are disclosed in U.S. Pat. No. 4,780,617.

Recently, there has been a tendency for each individual chip pattern of semiconductor elements to increase in size, and therefore, there has been a demand for an exposure system designed to transfer a larger mask pattern by a single exposure operation. To meet such a demand, scanning exposure systems have been proposed. In a typical scanning exposure system, a mask, which is being illuminated, is scanned in a first direction, and a photosensitive substrate is scanned in a second direction corresponding to the first direction in synchronization with the scanning of the mask, thereby transferring the mask pattern onto a shot region on the photosensitive substrate. Attention is being given, particularly, to what is called a step-and-scan type scanning exposure system, in which a mask pattern is sequentially transferred onto shot regions on a photosensitive substrate by repeating scanning exposure and stepping operation (refer to, e.g., U.S. Pat. Nos. 5,194,893 and 4,924,257).

Incidentally, as semiconductor elements are increasingly reduced in size and line width, the alignment accuracy required for the above-described exposure systems has become increasingly severe, and as the required alignment accuracy becomes increasingly strict, the tolerance of alignment becomes an extremely small value.

In the above-described step-and-scan type exposure system in particular, when a mask stage for mounting a mask and a substrate stage for mounting a substrate are moved for scanning, the center of gravity of equipment (including the mask stage, the substrate stage, the carriage for supporting the mask stage and the substrate stage, the vibration isolating table, the measuring system, etc.) shifts, and as the alignment accuracy becomes increasingly severe, the amount of shifting in the center of gravity has become of influence. The amount of distortion of the system caused by a shift in the center of gravity, the frequency of the system, the difference in resistance according to the scanning direction, vibration, etc. have also become of influence.

In the step-and-scan exposure system, if the scanning direction is assumed to be along the direction of the Y-axis, there are two different types of shots on a wafer: shots which are made when the substrate stage is scanned in the direction +y; and shots which are made when the substrate stage is scanned in the direction −y.

FIG. 3 in the accompanying drawings shows a layout of first shot regions (i.e. first-layer shot regions) formed on a wafer W by the step-and-scan exposure method. In the figure, the solid-line arrows indicate the direction (scanning direction) of movement of the wafer W during scanning exposure, and the dotted-line arrows indicate the direction of stepping of the substrate stage (wafer W).

Incidentally, mechanical conditions of the exposure system are different for the movement of the substrate stage in the direction +y than for the movement of the substrate stage in the direction −y. Therefore, it is not necessarily possible to say that the movement of the substrate stage in the direction +y and the movement of the substrate stage in the direction −y are completely compatible with each other in terms of exposure position. In other words, the scanning in the direction +y and the scanning in the direction −y each reflect a mechanical tendency peculiar to the system.

Accordingly, if the scanning exposure direction of the substrate stage in the preceding (first) exposure process and the scanning exposure direction of the substrate stage in the present (second) exposure process differ from each other, the alignment accuracy is reduced. This problem was found by the inventor of the present application.

SUMMARY OF THE INVENTION

The present invention provides a method in which a pattern of a mask is moved at a first speed relative to an object-side projection field of an optical projection system, and a plurality of shot regions on a photosensitive substrate onto which the mask pattern is to be transferred are sequentially moved at a second speed relative to an image-side projection field of the optical projection system, thereby scanning each shot region on the photo sensitive substrate, and transferring the mask pattern over each shot region by exposure. The method includes the steps of: storing, when n th (n≧2) scanning exposure is to be carried out for an arbitrary shot region on the photosensitive substrate, information concerning the direction of scanning of the arbitrary shot region and a first mask pattern in n−1 th or earlier scanning exposure carried out by using the first mask pattern; and scanning, when a second mask pattern is to be overlaid on the arbitrary shot region on the photosensitive substrate by the n th scanning exposure, the arbitrary shot region and the second mask pattern in the same direction as that indicated by the stored information.

In this case, it is preferable for the optical projection system to be a reduction optical projection system which projects each of the first and second mask patterns onto the photosensitive substrate at a magnification of 1/M, and that the speed of movement of the photosensitive substrate during scanning exposure should be set at 1/M with respect to the speed of movement of the first and second mask patterns during scanning exposure.

In addition, the present invention provides a scanning exposure method in which an image of a circuit pattern on a mask is projected onto a photosensitive substrate through an optical projection system, and thus a plurality of shot regions to be formed on the photosensitive substrate are sequentially exposed by a step-and-scan method, thereby transferring the mask circuit pattern onto each of the shot regions. The method includes the steps of: storing, when n th (n≧2) scanning exposure is to be carried out, information concerning the direction of scanning for each shot region in n−1 th or earlier scanning exposure carried out to transfer a circuit pattern of a first mask onto each shot region on the photosensitive substrate; and carrying out the n th scanning exposure with the scanning direction of each shot region made coincident with the direction indicated by the stored information, thereby overlaying a circuit pattern of a second mask on each shot region on the photosensitive substrate.

In this case, the scanning direction of each shot region when the first mask circuit pattern is transferred onto each shot region on the photosensitive substrate by scanning exposure may be stored, being classified into two different directions, i.e. first and second directions. Further, the method may include the steps of: calculating first array coordinates of each shot region scan-exposed in the first direction; calculating second array coordinates of each shot region scan-exposed in the second direction; overlaying the second mask circuit pattern on each shot region scan-exposed in the first direction by scanning exposure according to the first array coordinates; and overlaying the second mask circuit pattern on each shot region scan-exposed in the second direction by scanning exposure according to the second array coordinates.

In addition, the present invention provides a scanning exposure method including the steps of: preparing a mask arranged such that a pattern of the mask can move at a first speed relative to an object-side projection field of an optical projection system; preparing a photosensitive substrate arranged such that at least one shot region on the photosensitive substrate onto which the mask pattern is to be transferred by exposure can move at a second speed relative to an image-side projection field of the optical projection system; synchronously moving the mask at the first speed and the photosensitive substrate at the second speed, thereby transferring a pattern of a first mask onto at least one shot region on the photosensitive substrate by scanning exposure; storing information concerning the direction of the scanning in the scanning exposure; and carrying out, during a scanning exposure process executed after the scanning exposure with respect to at least one shot region among shot regions having the first mask pattern transferred thereto, scanning exposure by using a second mask in the same direction as the scanning direction indicated by the stored information, thereby overlaying a pattern of the second mask on the at least one shot region having the first mask pattern transferred thereto.

In addition, the present invention provides a method in which an image of a circuit pattern on a mask is projected onto a photosensitive substrate through an optical projection system, and a plurality of shot regions to be formed on the substrate are sequentially exposed by a step-and-scan method, thereby transferring the mask circuit pattern onto the shot regions, and thus producing circuit elements on the substrate. The method includes the steps of: (a) preparing an n−1 th mask for transferring a circuit pattern for an n−1 th layer of circuit elements onto the substrate by exposure; (b) determining a scanning sequence for transferring the circuit pattern of the n−1 th mask onto each of a plurality of shot regions to be formed on the substrate by scanning exposure on the basis of design data concerning the shot regions; (c) transferring the circuit pattern of the n−1 th mask onto each of positions corresponding to the shot regions on a photosensitive layer formed on a surface of the substrate by a step-and-scan exposure method according to the determined scanning sequence; (d) chemically or physically processing the substrate exposed using the n−1 th mask to form an n−1 th layer of the circuit elements, and thereafter, forming a photosensitive layer on the surface of the substrate in preparation for exposure to form a following n th layer; and (e) preparing an n th mask for transferring a circuit pattern for the n th layer by exposure, and transferring the circuit pattern of the n th mask onto each of a plurality of shot regions on the substrate formed with the n−1 th layer by a step-and-scan exposure method according to the same scanning sequence as that used in the scanning exposure carried out using the n−1 th mask.

According to the scanning exposure method of the present invention, the scanning direction in scanning exposure carried out by using a preceding, first mask pattern and the scanning direction in scanning exposure carried out by using a succeeding., second mask pattern are made coincident with each other. Therefore, alignment accuracy is improved.

BRIEF DESCRIPTION OF THE DRAWINGS

FIG. 2 illustrates a file stored with parameters used for exposure.

DETAILED DESCRIPTION OF THE PREFERRED EMBODIMENTS

Figure 1:
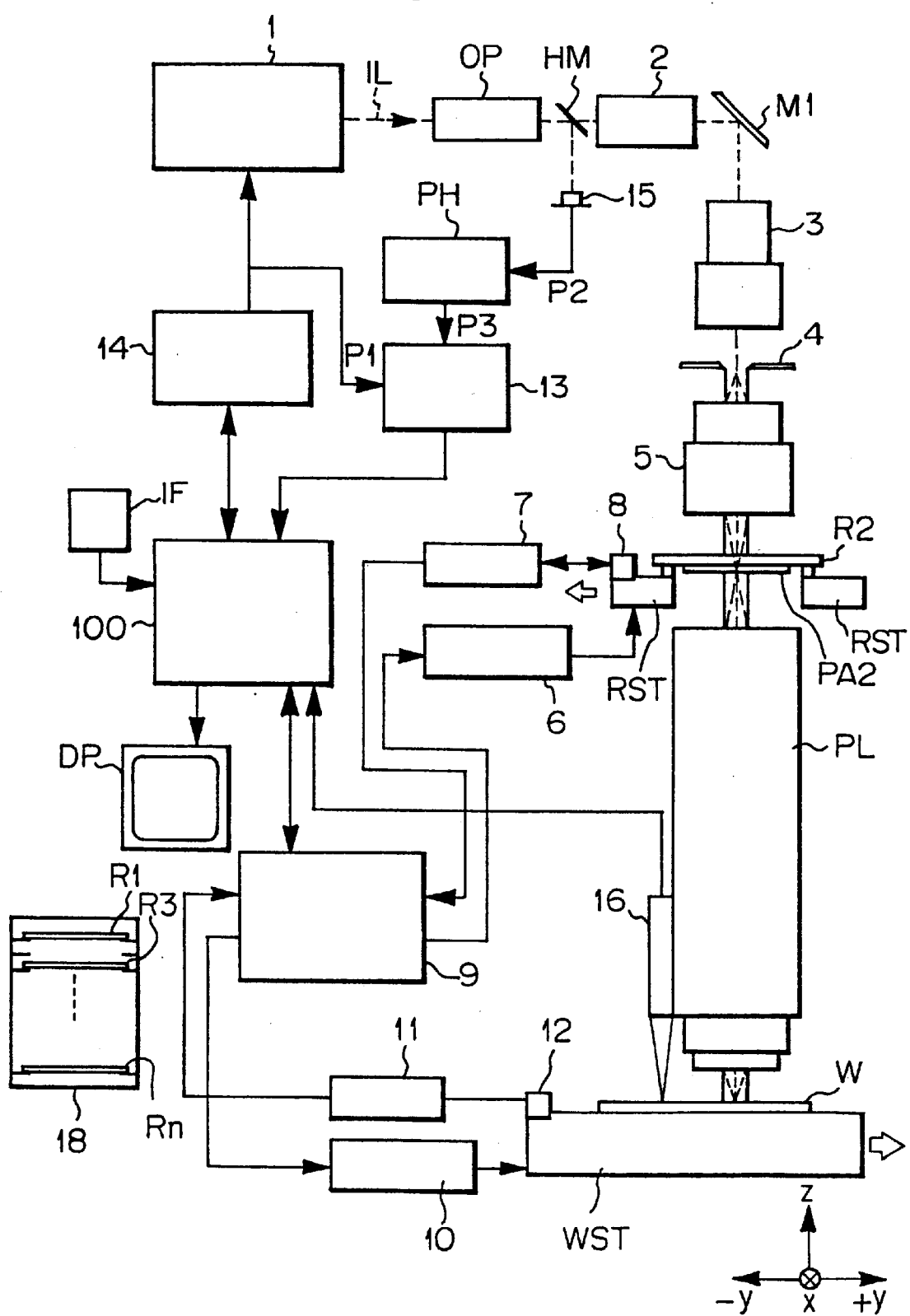
FIG. 1 schematically shows the arrangement of an exposure system which may be suitably used to carry out an embodiment of the present invention.

A first embodiment of the present invention will be described below. FIG. 1 schematically shows the arrangement of an exposure system which may be suitably used to carry out the first embodiment of the present invention. Illuminating light IL emitted from a light source 1 enters a lens system OP for uniformly illuminating a mask R. The lens system OP is an optical system which includes an optical integrator, e.g. a fly's-eye lens, a σ stop for adjusting the NA of illuminating light IL, a filter for varying the configuration of an image of a secondary light source that is formed on an exit surface of the optical integrator, etc. The light source 1 is, for example, a high-pressure mercury vapor lamp, an excimer laser that uses KrF, ArF, etc., or a YAG laser. In this embodiment, it is assumed that the light source 1 is an excimer layer that uses KrF, and that the illuminating light IL is laser light having a center wavelength of 248 nm. Illuminating light IL emanating from the lens system OP reaches a blind 4 via lens systems 2 and 3 and a mirror M1. Illuminating light IL passing through the blind 4 is converged on the mask R, which is formed with a predetermined circuit pattern PA, by a lens system 5 including a condenser lens. FIG. 1 shows the system in a state where a mask R2, which is provided with a circuit pattern PA2 for second exposure, is placed on a mask stage RST. Illuminating light IL passing through the mask R2 reaches the surface of a wafer W through an optical projection system PL. The distance between the mask R2 and the wafer W in the direction of the optical axis of the optical projection system PL has been adjusted so that the mask R2 and the wafer W are in conjugate relation to each other with respect to the optical projection system PL. The optical projection system PL is a reduction optical projection system that projects the circuit pattern PA2 of the mask R2 at a magnification of 1/4×. Thus, an image of the circuit pattern PA2 is formed (as an image 4 times demagnified) on the wafer W by the optical projection system PL. The blind 4 is formed from two L-shaped light-blocking members. The blind 4 is placed in conjugate relation to the mask R2 by the lens system 5. The positional relationship between the two light-blocking members, which form the blind 4, has been adjusted so that a slit-shaped illuminated region which has a longitudinal axis in a direction perpendicular to the scanning direction is formed on the mask R2.

The mask stage RST, which has the mask R2 placed thereon, is movable in both directions +y and −y (i.e. scanning direction) by a mask driver 6. The position of the mask stage RST is measured by a mask interferometer 7. The mask interferometer 7 applies laser light to a mirror 8 provided on the mask stage RST, and receives reflected light from the mirror 8 to thereby measure the position of the mask stage RST. The mask interferometer 7 outputs the result of measurement to a stage controller 9. The wafer W is placed on a wafer stage WST. The wafer stage WST is movable in both directions +y and −y (i.e. scanning direction) by a wafer driver 10 and also movable in a direction x which is perpendicular to the direction y. The wafer stage WST is also movable in a direction z (i.e. the direction of the optical axis of the optical projection system PL) by the wafer driver 10, thus enabling the surface of the wafer W to coincide with the focus position of the optical projection system PL (i.e. the position where the circuit pattern PA2 of the mask R2 is formed). The position of the wafer stage WST is measured by a wafer interferometer 11. The wafer interferometer 11 applies laser light to a mirror 12 provided on the wafer stage WST, and receives reflected light from the mirror 12 to thereby measure the position of the wafer stage WST. The wafer interferometer 11 outputs the result of measurement to the stage controller 9. The stage controller 9 causes the mask stage RST and the wafer stage WST to move in the direction y in synchronization with each other on the basis of positional information sent from each of the mask and wafer interferometers 7 and 11. Because the optical projection system PL is an optical system that forms an inverted image of the mask pattern P2 on the wafer W, the directions of movement of the mask stage RST and the wafer stage WST are opposite (opposite in phase) to each other. That is, assuming that the speed of movement of the mask stage RST is VM, the stage controller 9 sets the speed of movement of the wafer stage WST at VM/4 (i.e. a speed obtained by multiplying the speed VM by the magnification of 1/4×), and causes the mask stage RST and the wafer stage WST to move synchronously. At this time, if the mask stage RST moves in the direction −y at the speed VM, the wafer stage WST moves in the direction +y at the speed of VM/4. The term "scanning direction" as used in the following description means the scanning direction of the wafer stage WST (and thus the wafer W) during scanning exposure. The stage controller 9 also controls each of the mask and wafer stages RST and WST with a predetermined servo gain so that a difference between a value measured by the mask interferometer 7 and converted to a coordinate value in the wafer coordinate system and a value measured by the wafer interferometer 11 is zero during scanning exposure. The stage controller 9 is connected to a main control system 100. Thus, the main control system 100 controls the positions of the mask stage RST and the wafer stage WST through the stage controller 9.

An off-axis alignment sensor 16 is provided outside the optical projection system PL. The alignment sensor 16 has a predetermined index mark which is provided in a sensor element. The main control system 100 moves the wafer stage WST so that an alignment mark in a shot region formed on the wafer W coincides with the center of the index mark. The alignment sensor 16 simultaneously images an alignment mark on the wafer W and the index mark, and detects a positional displacement of the alignment mark on the wafer W with respect to the index mark. A detection signal from the alignment sensor 16 is sent to the main control system 100. The main control system 100 obtains the position in the wafer coordinate system of the alignment mark on the wafer W on the basis of the coordinate position of the wafer stage WST and the amount of positional displacement of the alignment mark.

Further, a mirror HM is provided in the optical path between the light source 1 and the mask R to branch the illuminating light IL. Illuminating light IL branched off by the mirror HM is photoelectrically converted by an integrator sensor 15 to form a signal P2. The signal P2 from the integrator sensor 15 is held by a peak hold circuit PH, and a signal P3 from the peak hold circuit PH is supplied to a comparator circuit 13. The comparator circuit 13 makes a comparison between a signal P1 indicating the intensity of illuminating light, which is output from an exposure controller 14, and the signal P3 from the peak hold circuit PH, and outputs a difference between the two signals P1 and P3 to the main control system 100. The output of the light source 1 is controlled by the exposure controller 14. The main control system 100 controls the output of the light source 1 through the exposure controller 14 so that the difference between the signals P1 and P3, which is output from the comparator circuit 13, becomes zero.

Usually, each individual semiconductor element is formed by repeating exposure a plurality of times, as has been described above. A plurality (n) of masks which are to be used in a semiconductor element producing process are held in a mask stocker 18, and a mask which is needed for each individual exposure is transported from the mask stocker 18 to the mask stage RST by a transport system (not shown) under the control of the main control system 100.

The main control system 100 has been stored with process program files PPF (hereinafter referred to as "file PPF") containing the record of an exposure sequence, etc. A series of alignment and exposure operations carried out by the system shown in FIG. 1 are executed according to data stored in a file PPF.

FIG. 2 schematically shows the structure of a file PPF. The file PPF has the following nine parameter groups:
(1) File name
(2) Reticle parameter group
(3) Wafer parameter group
(4) Exposure condition parameter group
(5) Alignment parameter group
(6) Transport condition parameter group
(7) Illumination condition parameter group
(8) Optional condition parameter group
(9) Error log setting parameter group The part of the file PPF which is entitled "(1) File name" is stored with two parameters, i.e. attribute parameter group, and layer. A file attribute parameter indicates, for example, a data file, a program file, etc. The term "layer" as used herein means a parameter that indicates the ordinal number of a layer for which this file PPF is to be used to transfer a circuit pattern by exposure.

The part of the file PPF which is entitled "(2) Reticle parameter group" is stored with three parameters, i.e. pattern size, mark layout, and writing error. The mark layout contains a parameter concerning the layout of alignment marks formed on the wafer W (including a parameter concerning a mark configuration).

The part of the file PPF which is entitled "(3) Wafer parameter group" is stored with parameters concerning a shot region size, a scanning direction of each shot region in scanning exposure, and a direction of stepping of the wafer stage WST. Exposure is carried out on the basis of parameters stored as a shot region size, scanning direction, and stepping direction (described later). The shot region size parameter includes design values of shot region array coordinates.

The part of the file PPF which is entitled "(4) Exposure condition parameter group" is stored with six parameters, i.e. amount of exposure, blind, focal point, magnification, leveling, and offset.

The part of the file PPF which is entitled "(5) Alignment parameter group" is stored with three parameters, i.e. sensor, method, and offset. The sensor parameter designates which sensor should be used for alignment when the exposure system is equipped with a plurality of alignment sensors. The method parameter designates an alignment method, e.g. D/D alignment, ordinary global alignment, EGA, two-system EGA, etc. and shot regions for alignment which are to be measured (hereinafter referred to as "alignment shot regions"). The offset is a parameter indicating, for example, an offset value to be added to a value measured by an alignment sensor. The two-system EGA is a method in which array coordinates of shot regions scan-exposed in the direction −y and array coordinates of shot regions scan-exposed in the direction +y are individually obtained to effect alignment (described later in detail).

The part of the file PPF which is entitled "(6) Transport condition parameter group" is stored with two parameters, i.e. ASIC compatible, and screen synthesis.

The part of the file PPF which is entitled "(7) Illumination condition parameter group" is stored with a total of three parameters, i.e. parameters concerning the configurations of secondary light sources such as a modified light source, a stop, etc. and a parameter concerning NA of the optical projection system PL.

The part of the file PPF which is entitled "(8) Optional condition parameter group" is stored with parameters concerning peripheral exposure, in which only the peripheral portion of a wafer is exposed in advance, DP, in which exposure is carried out with the wafer W being moved in the direction z, and so forth.

The part of the file PPF which is entitled "(9) Error log setting parameter group" is stored with parameters such as synchronous error between the mask stage RST and the wafer stage WST, and so forth.

The file PPF is previously recorded on a floppy disk or the like, and it is read by a floppy disk drive in the main control system 100 and stored in a memory. These parameters can be corrected by the operator through an input device IF such as a keyboard.

The main control system 100 controls the exposure controller 14, the stage controller 9, etc., and outputs the above-described parameter information, exposure condition, etc. to a display DP.

Figure 3:
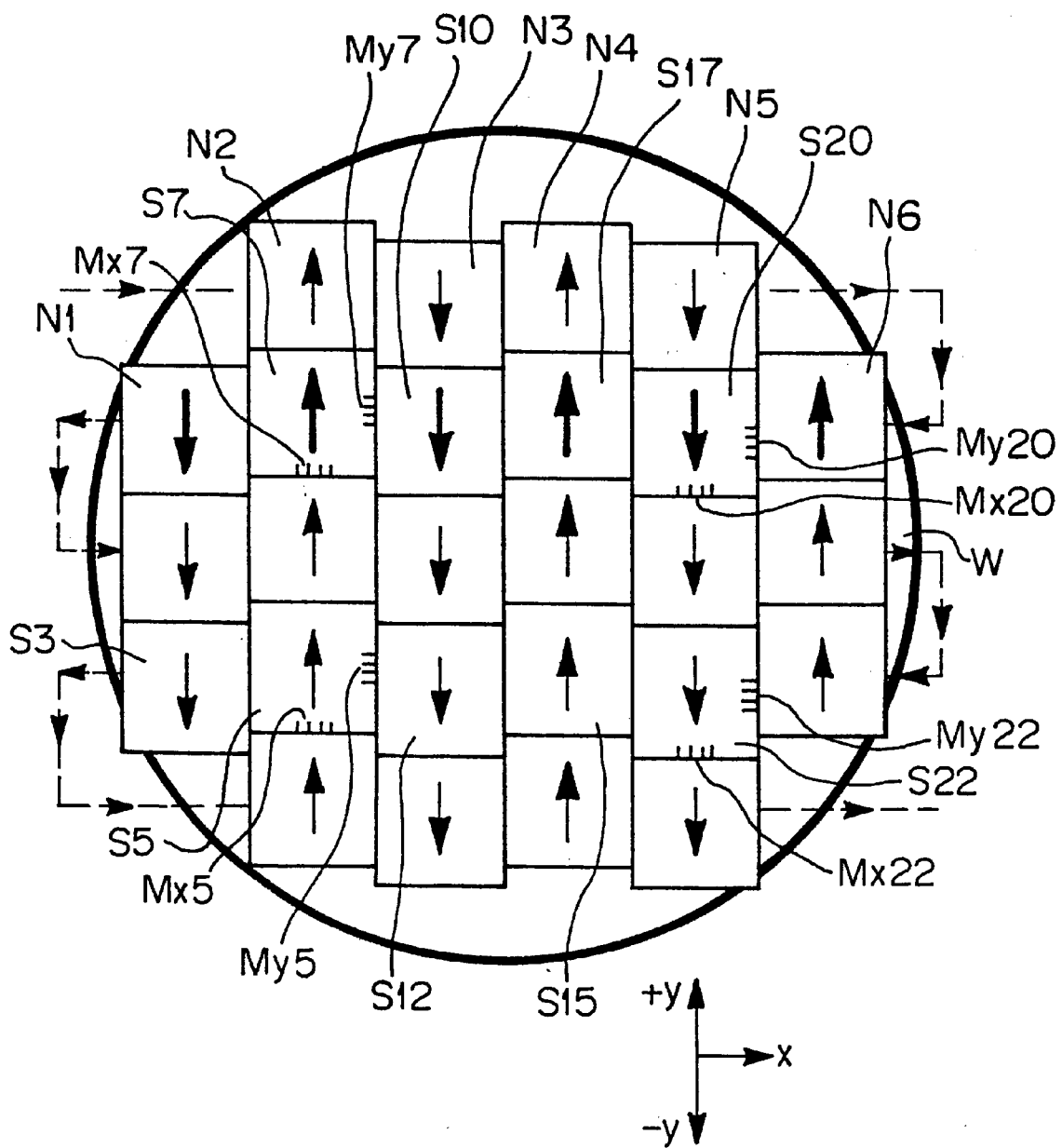
FIG. 3 shows first shot regions formed by exposure with a first-layer circuit pattern.

FIG. 3 shows a layout of first shot regions (i.e. first-layer shot regions) formed on the wafer W by the step-and-scan exposure method using the system shown in FIG. 1. In the figure, the solid-line arrows indicate the direction (scanning direction) of movement of the wafer stage WST (wafer W) during scanning exposure, and the dotted-line arrows indicate the direction of stepping of the wafer stage WST (wafer W).

Assuming that the scanning direction is the direction of the y-axis, shot trains which are indicated by reference characters N1, N3 and N5 are rows of shot regions scan-exposed in the direction −y. That is, the shot trains N1, N3 and N5 are sets of shot regions each formed by stepping the wafer stage WST in the direction x to thereby move the wafer W to the exposure start position (i.e. alignment target position), and then carrying out scanning exposure while moving the wafer W in the direction −y.

Shot trains which are denoted by reference characters N2, N4 and N6 are rows of shot regions scan-exposed in the direction +y. That is, the shot trains N2, N4 and N6 are sets of shot regions each formed by stepping the wafer stage WST in the direction x to thereby move the wafer W to the exposure start position (i.e. alignment target position), and then carrying out scanning exposure while moving the wafer W in the direction +y.

Although FIG. 3 shows a layout of shot regions formed by first exposure so that all shot regions in each of the vertical rows (i.e. rows in the direction y) have the same scanning direction, it is possible to adopt a layout of shot regions in which the scanning direction is different from that in FIG. 3. From the viewpoint of improving throughput, first exposure may be carried out by the step-and-scan method so that the scanning direction alternates between each pair of adjacent shot regions in terms of stepping order. It is also possible to carry out first exposure so that, when the wafer stage WST is stepped in the direction x, exposure is carried out by the step-and-scan method so that the scanning direction alternates between each pair of adjacent shot regions, whereas, when the wafer stage WST is stepped in the direction y, exposure is carried out so that each pair of adjacent shot regions have the same scanning direction. At this time, the stage controller 9 may control the servo gain for controlling the wafer stage WST so that the servo gain used during scanning exposure (synchronous servo gain) is different from the servo gain used during stepping in the direction y (position servo gain), thereby stabilizing the positioning accuracy.

Each shot region is provided with grating-shaped alignment marks Mx and My. Although in FIG. 3 only the alignment marks Mx and My of specific alignment shot regions S5, S7, S20 and S22 are shown, all the shot regions are provided with similar alignment marks.

Next, the exposure operation will be explained.

Figure 4:
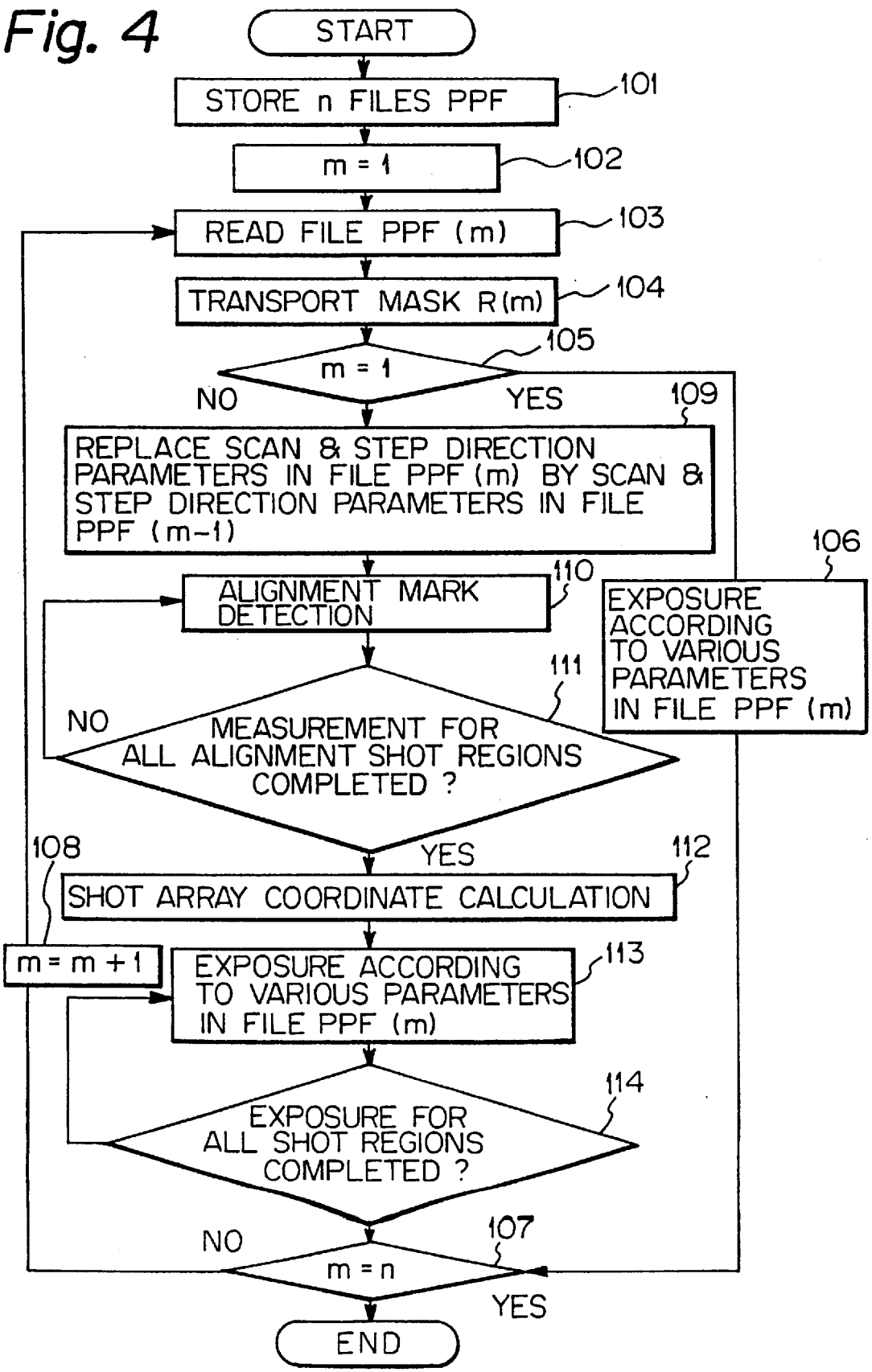
FIG. 4 illustrates an exposure sequence in a first embodiment of the present invention.

FIG. 4 is a flowchart for explaining the exposure operation.

Step 101:

At step 101, the main control system 100 stores files PPF corresponding to layers necessary for semiconductor elements to be produced. In this embodiment, it is assumed that n files PPF are stored in the memory.

Step 102:

The main control system 100 sets the initial value of an internal counter m to 1.

Step 103:

A file PPF having a layer parameter coincident with the value set in the counter m is read out from the memory. If m=1 has been set, a file PPF in which the layer parameter is 1, that is, a file PPF (M=1) which is used to transfer a first-layer circuit pattern, is read out from the memory.

Step 104:

The main control system 100 transports a mask R(m) to the mask stage RST on the basis of the reticle parameter in the file PPF read out at step 103. Assuming that the layer parameter is 1, a mask that is designated by the reticle parameter is a mask R(1) which is formed with a first-layer circuit pattern, and the main control system 100 transports the mask R(1) to the mask stage RST.

Step 105:

The main control system 100 judges whether or not the layer parameter of the readout file PPF is 1. If the layer parameter is 1, the process proceeds to step 106, whereas, if it is not 1, the process proceeds to step 109.

Step 106:

The alignment parameter group in the file PPF (M=1) contains the record of design values of shot region array coordinates as shot region size parameters. The main control system 100 scans the wafer stage WST and the mask stage RST synchronously on the basis of the shot region array coordinates, a combination of a scanning direction (e.g. the direction +y) and a stepping direction (the directions xy), which have been recorded as parameters in the wafer parameter group, the exposure condition parameters, and the illumination condition parameters, and while doing so, the main control system 100 projects the pattern of the mask R1 onto the wafer W. By repeating the scanning exposure and the stepping of the wafer stage WST, the main control system 100 carries out exposure by the step-and-scan method.

Step 107:

The main control system 100 judges whether or not the value of the counter m is n. If the counter value is not n, the process proceeds to step 108. If the counter value is n, it is decided that n exposure operations have been completed, and the exposure sequence terminates.

Step 108:

1 is added to the value of the counter m to update the counter m (m=m+1), and the process returns to step 103.

Then, the above-described operations at steps 103 to 105 are executed.

If a file PPF (m≠1) in which the layer parameter is not 1 is read at step 105, the process proceeds to step 109, as has been described above.

Step 109:

The main control system 100 replaces the parameters concerning the scanning and stepping directions in the wafer parameter group in the file PPF (m) by the parameters concerning the scanning and stepping directions in the file PPF (m−1) used in the preceding exposure. Assuming that the layer parameter is 2, the parameters concerning the scanning and stepping directions in the file PPF (2) which is to be used for second-layer exposure are replaced by the parameters concerning the scanning and stepping directions in the file PPF (1) used in the first-layer exposure.

Step 110:

The main control system 100 measures the positions of the alignment marks of specific alignment shot regions among the shot regions formed on the wafer W by using the alignment sensor 16 and the wafer interferometer 11 on the basis of various parameters in the file PPF (m), i.e. the alignment mark layout (mark configuration) designated by the reticle parameter group, the parameters designated by the alignment parameter group (designated alignment sensor, alignment method and alignment shot regions, offset, etc.), and the parameters designated by the wafer parameter group (design values of shot region array coordinates, etc.).

In this embodiment, it is assumed that a mark layout related to grating-shaped marks Mx and My such as those shown in FIG. 3, which are used as alignment marks, and the alignment sensor 16 have been designated, and that the EGA method has been designated as an alignment method. Further, it is assumed that regions denoted by S5, S7, S20 and S22 in FIG. 3 have been designated as alignment shot regions. The alignment sensor 16 detects the positions of the alignment marks formed in these alignment shot regions (i.e.

marks Mx5, My5, marks Mx7, My7, marks Mx20, My20, and marks Mx22, My22). The order in which the alignment mark positions are measured is usually determined so that the time required for the measurement is shortest.

Step 111:

The main control system 100 judges whether or not the alignment mark position measurement has been completed with respect to all the designated alignment shot regions. If it is judged that the measurement for all the designated alignment shot regions has been completed, the process proceeds to step 112, whereas, if the measurement has not yet been completed, the process returns to step 110 to continue the alignment mark position measurement.

Step 112:

The main control system 100 calculates array coordinates of shot regions to be exposed on the basis of information concerning the measured alignment mark positions. Because the EGA method has been selected in this embodiment, the main control system 100 calculates array coordinates of shot regions to be exposed by using a statistic computing technique on the basis of the measured alignment mark positions, the design values of the shot region array coordinates, and a predetermined model expression.

Step 113:

The main control system 100 scans the wafer stage WST and the mask stage RST synchronously on the basis of the shot region array coordinates calculated at step 112, the scanning direction (e.g. the direction +y) and the stepping direction (the directions xy), which have been recorded as parameters in the wafer parameter group, the exposure condition parameters, and the illumination condition parameters, and while doing so, the main control system 100 projects the pattern of the mask R1 onto the shot regions on the wafer W. By repeating the scanning exposure and the stepping of the wafer stage WST, an image of the circuit pattern on the mask R(m) is overlaid on and transferred to each shot region by the step-and-scan exposure method. Because the direction of scanning exposure in the present exposure process has been determined to be the same as the direction of scanning exposure in the preceding exposure process at step 109, scanning exposure is carried out with the scanning direction in the preceding exposure (for the m−1 th layer) coincident with the scanning direction in the present exposure (for the m th layer).

Step 114:

The main control system 100 judges whether or not exposure has been completed with respect to all the shot regions on the wafer W. If it is judged that exposure for all the shot regions has been completed, the process proceeds to step 107, whereas, if exposure for all the shot regions has not yet been completed, the process returns to step 113 to continue the exposure processing.

Although in the above-described sequence the shot regions S5, S7, S20 and S22 in FIG. 3 are used as alignment shot regions, it should be noted that alignment shot regions are not necessarily limited to them. For example, alignment shot regions may be the shot regions S5, S7, S10, S12, S15, S17, S20 and S22, and shot region array coordinates may be calculated on the basis of a total of four items (i.e. four items for each of the directions x and y) of alignment mark position information, i.e. mean values (a mean value of Mx and a mean value of My) of the alignment mark positions of the shot regions S5 and S12, mean values of the alignment mark positions of the shot regions S7 and S10, mean values of the alignment mark positions of the shot regions S15 and S22, and mean values of the alignment mark positions of the shot regions S17 and S20.

Next, a second embodiment of the present invention will be explained.

In this embodiment, when alignment is carried out by the EGA method, shot region array coordinates are managed for each scanning direction (i.e. each of the directions +y and −y) during exposure. That is, array coordinates of shot regions scan-exposed in the direction +y and array coordinates of shot regions scan-exposed in the direction −y are individually calculated, and exposure is carried out on the basis of the array coordinates of each shot region. The arrangement of a system for carrying this embodiment is similar to that of the system shown in FIG. 1; therefore, description thereof is omitted. The method of selecting alignment shot regions for global alignment for the EGA in this embodiment will be explained below with reference to FIGS. 3 and 5.

Figure 5:
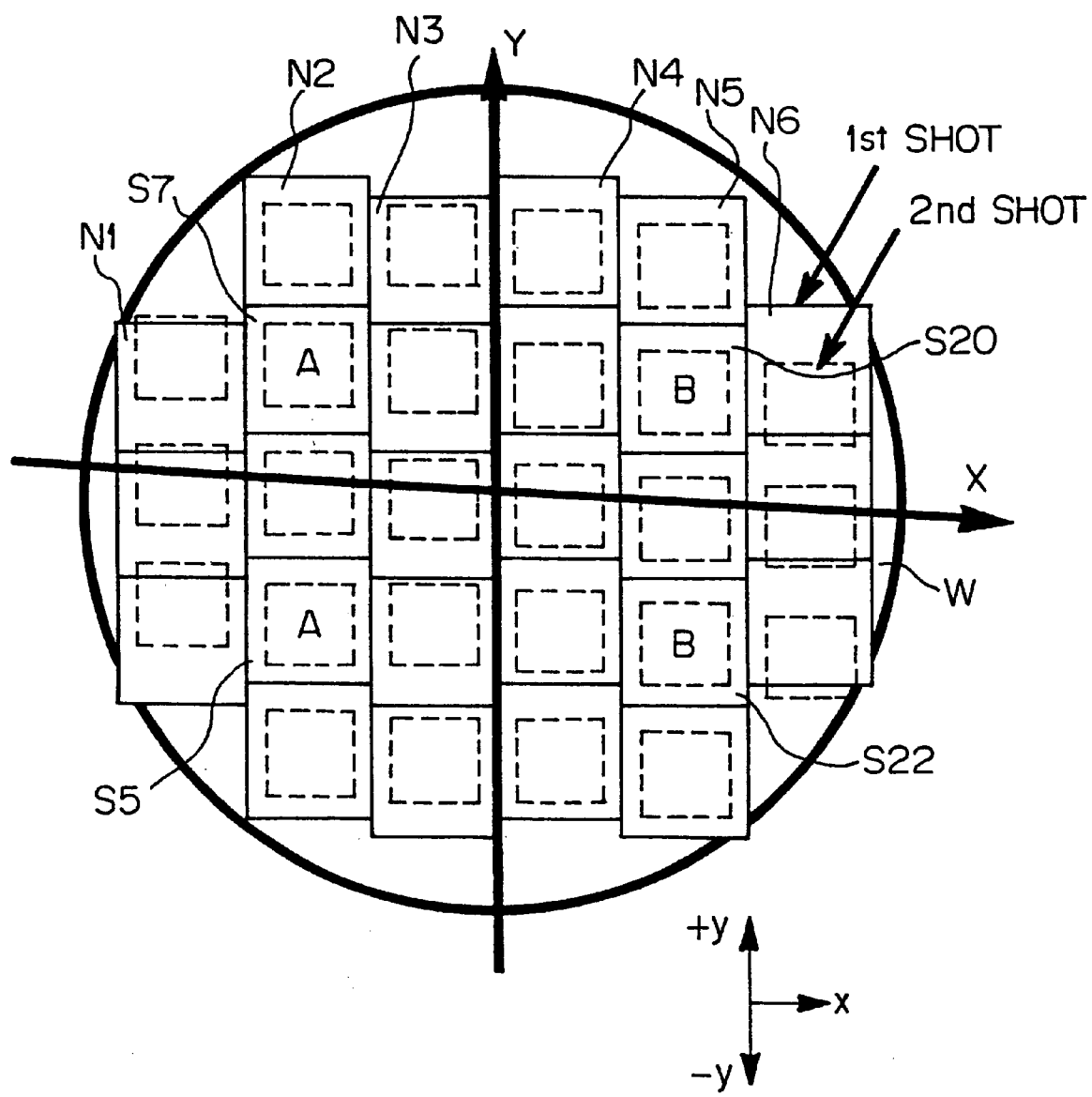
FIG. 5 shows second shot regions overlaid on first shot regions.

FIG. 5 shows a layout of first shot regions formed on the wafer W by the step-and-scan exposure method, as shown in FIG. 3. In this embodiment also, the scanning direction the direction of the y-axis. In FIG. 5 also, shot trains N1, N3 and N5 are rows of shot regions scan-exposed in the direction −y, and shot trains N2, N4 and N6 are rows of shot regions scan-exposed in the direction +y.

In FIG. 5, alignment shot regions A are two shot regions (S5 and S7) selected from a shot train scan-exposed in the direction +y, and alignment shot regions B are two shot regions (S20 and S22) selected from a shot train scan-exposed in the direction −y.

FIG. 5 shows the way in which it is recognized that the shot region array is displaced in the direction +y as a result of measurement of the positions of alignment marks (Mx5, My5, Mx7 and My7) provided in the alignment shot regions A with the alignment sensor 16, and it is also recognized that the shot region array is displaced in the direction −y as a result of measurement of the positions of alignment marks (Mx20, My20, Mx22 and My22) provided in the alignment shot regions B with the alignment sensor 16. That is, shot region array coordinates obtained by the above-described EGA calculation form a coordinate system having its x-axis rotated (i.e. a coordinate system in which a rotation error is present). More specifically, a group of shot regions in which shot regions scan-exposed in the direction +y and shot regions scan-exposed in the direction −y are mixed are selected as alignment shot regions, and the positions of the alignment shot regions are measured. Thereafter, array coordinates of shot regions to be aligned are calculated by the EGA method. Consequently, the calculation of shot region array coordinates is biased according to the mixture ratio between the alignment shot regions scan-exposed in the direction +y and the alignment shot regions scan-exposed in the direction −y, causing errors in coordinate calculation for, for example, scaling, rotation, and perpendicularity. As a result, the alignment accuracy reduces.

In FIG. 5, second shot regions (i.e. second-layer shot regions) formed by exposure according to the shot region array coordinates containing a rotation error, as described above, are shown by the dotted lines. Because the second shot regions, shown by the dotted lines, are formed by exposure according to the array coordinates of the shot regions containing the rotation error, the pattern of the mask for second shot regions is projected without an alignment error with respect to the first shot regions in only a total of four shot regions, i.e. the alignment shot regions A and B. In the other shot regions, however, alignment errors arise, as shown in FIG. 5.

Figure 6:
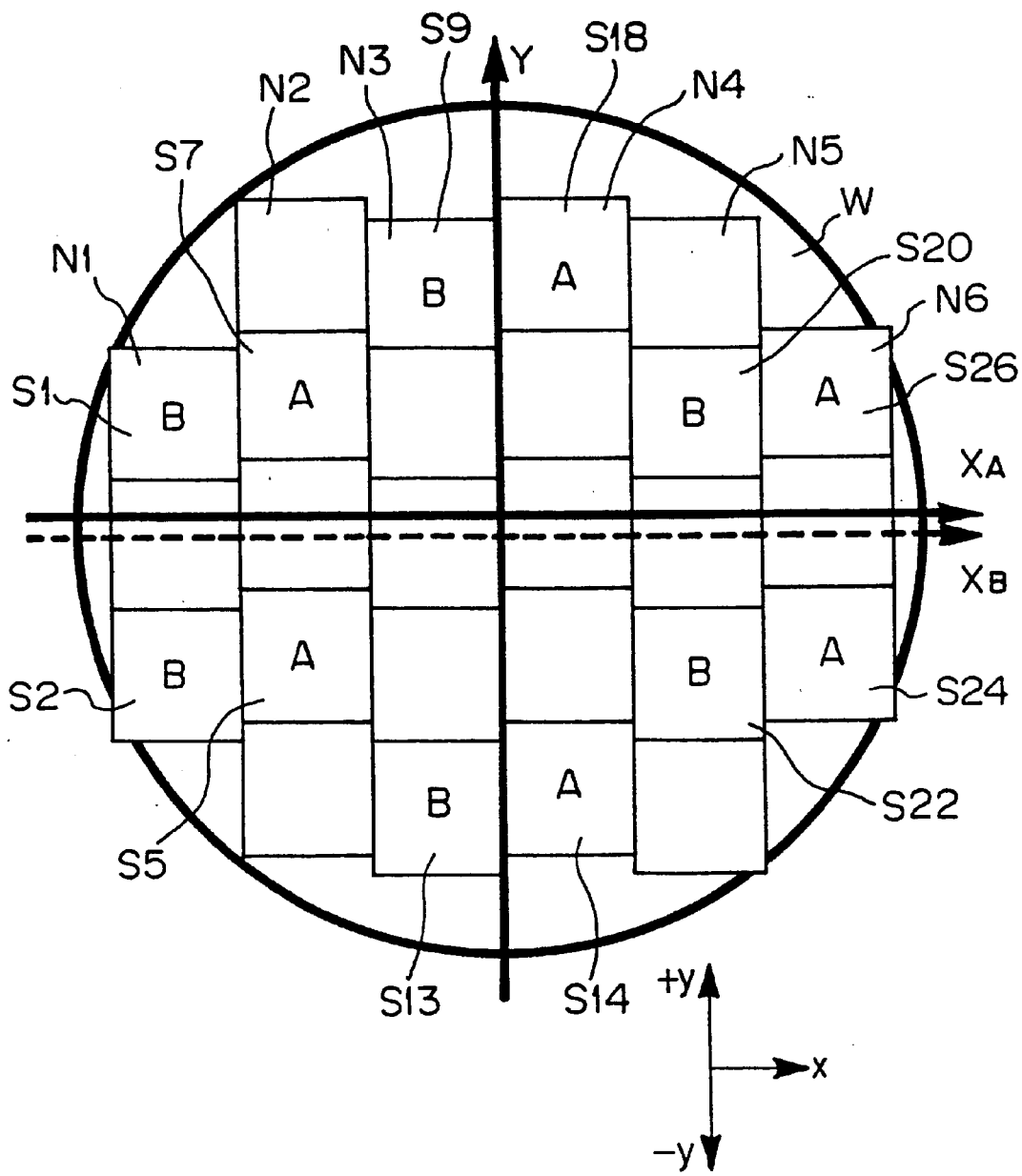
FIG. 6 illustrates shot array coordinate calculation performed for each scanning direction in exposure carried out to form first shot regions.

FIG. 6 shows an exposure method in which the alignment error is taken into consideration (i.e. an exposure method according to this embodiment).

The exposure method will be explained below. For first shot regions (N2, N4 and N6) formed by scanning exposure carried out in the direction +y, shot region array coordinates XY (A) are calculated on the basis of positional information concerning alignment marks of an alignment shot region group A (a set of alignment shot regions selected from the shot regions scan-exposed in the direction +y). For first shot regions (N1, N3 and N5) formed by scanning exposure carried out in the direction −y, shot region array coordinates XY (B) are calculated on the basis of positional information concerning alignment marks of an alignment shot region group B (a set of alignment shot regions selected from the shot regions scan-exposed in the direction −y). The shot regions (N2, N4 and N6) are each moved to a predetermined exposure start position on the basis of the shot region array coordinates XY (A), and an image of a circuit pattern for second shot regions is overlaid on and transferred to each shot region by the step-and-scan exposure method. The shot regions (N1, N3 and N5) are each moved to a predetermined exposure start position on the basis of the shot region array coordinates XY (B), and an image of the circuit pattern for second shot regions is overlaid on and transferred to each shot region by the step-and-scan exposure method. This alignment method is referred to as "two-system EGA method".

In comparison with the alignment by the EGA method in the first embodiment, the above-described method needs to perform shot region array coordinate calculation twice. However, there is practically no problem because the computational speed of the main control system 100 is so high that the calculation of shot region array coordinates, which is performed twice, has no effect on the throughput.

Figure 7:
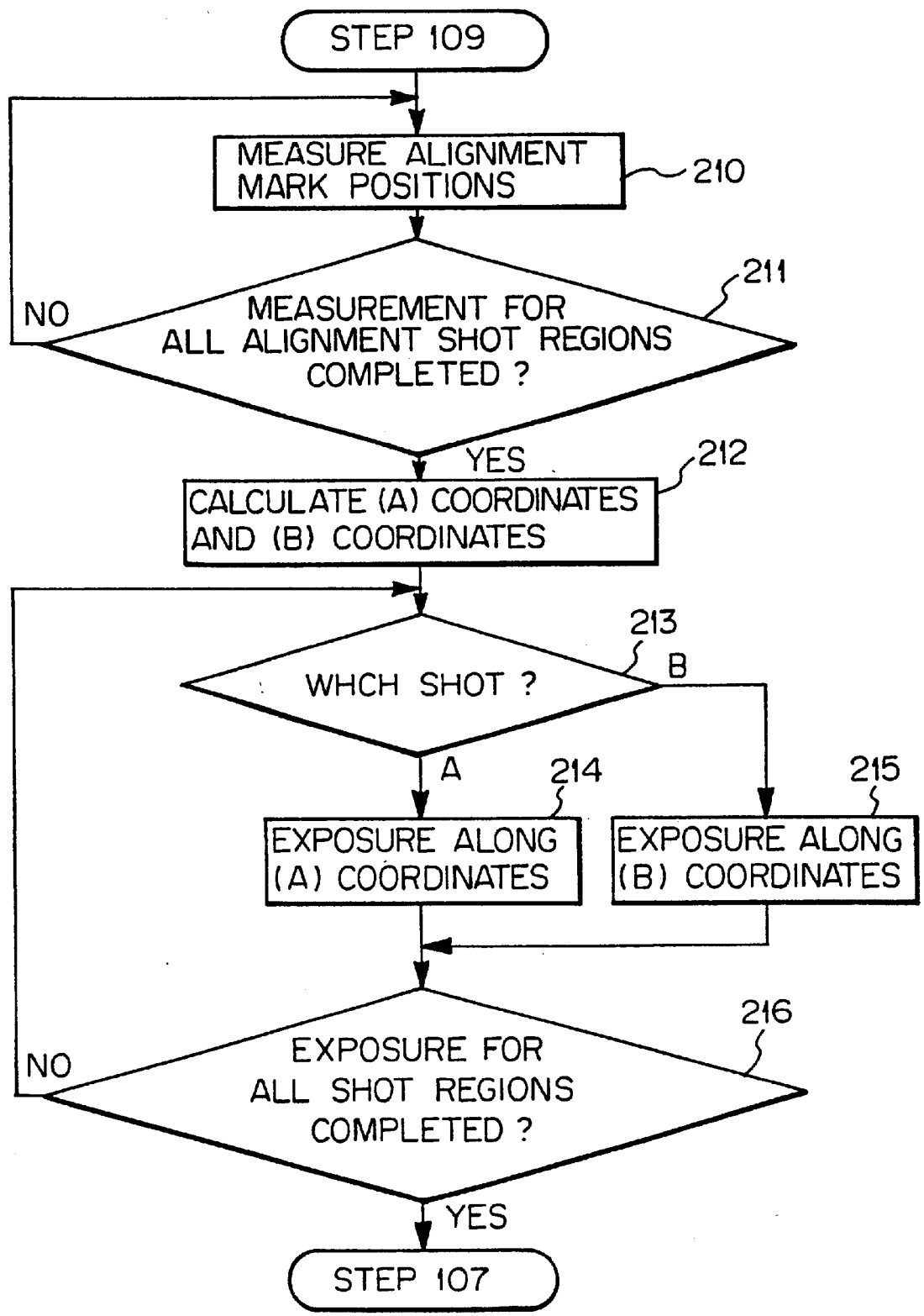
FIG. 7 illustrates an exposure sequence in a second embodiment of the present invention.

Next, the exposure sequence in this embodiment will be explained with reference to FIGS. 4 and 7. FIG. 7 is a flowchart showing a part which is characteristic of the exposure sequence in this embodiment.

In the exposure sequence of this embodiment, steps 110 to 114 in the exposure sequence shown in FIG. 4 are replaced by the exposure sequence shown in FIG. 7.

Therefore, description of the part of the exposure sequence in this embodiment which is the same as in the exposure sequence shown in FIG. 4 is omitted, and the following description will center on the sequence shown in FIG. 7.

Steps 101 to 105 shown in FIG. 4 are executed as has been described in regard to the first embodiment.

When the main control system 100 judges that m=1 at step 105, steps 106 to 10B are executed in the same way as in the first embodiment.

When it is judged that m≠1 at step 105, step 109 is executed. Thereafter, the process proceeds to step 210 in FIG. 7.

Step 210:

The main control system 100 measures the alignment mark positions of specific alignment shot regions among the shot regions formed on the wafer W by using the alignment sensor 16 and the wafer interferometer 11 on the basis of various parameters in the file PPF (m), i.e. the alignment mark layout (mark configuration) designated by the reticle parameter group, the parameters designated by the alignment parameter group (designated alignment sensor, alignment method and alignment shot regions, offset, etc.), and the parameters designated by the wafer parameter group (design values of shot region array coordinates, etc.).

In this embodiment, it is assumed that a mark layout related to alignment marks Mx and My such as those shown in FIG. 3, and the alignment sensor 16 have been designated, and that the above-described two-system EGA method has been designated as an alignment method. Further, it is assumed that the alignment shot region group A (S5, S7, S14, S18, S24 and S26) and the alignment shot region group B (S1, S2, S9, S13, S20 and S22) in FIG. 6 have been designated as alignment shot regions. The alignment sensor 16 detects the positions of the alignment marks formed in these alignment shot regions. At this time, information concerning whether the mark positions measured with the alignment sensor 16 are associated with the alignment shot region group A or the alignment shot region group B is also recorded in the memory. Alternatively, there are prepared two memory regions for respectively storing the mark positions associated with the alignment shot region group A and the mark positions associated with the alignment shot region group B. The order in which the mark positions in the alignment shot region groups A and B are measured is usually determined so that the time required for the measurement is shortest.

Step 211:

The main control system 100 judges whether or not the alignment mark position measurement has been completed with respect to all the designated alignment shot regions. If it is judged that the measurement for all the designated alignment shot regions has been completed, the process proceeds to step 212, whereas, if the measurement has not yet been completed, the process returns to step 210 to continue the alignment mark position measurement.

Step 212:

The main control system 100 calculates array coordinates of shot regions to be exposed on the basis of information concerning the measured alignment mark positions. Because the two-system EGA method has been selected in this embodiment, the main control system 100 calculates array coordinates XY (A) of the shot regions to be exposed by using a statistical computing technique on the basis of the measured alignment mark positions of the alignment shot region group A, the design values of the shot region array coordinates, and a predetermined model expression. Further, the main control system 100 calculates array coordinates XY (B) of shot regions to be exposed by using a statistical computing technique on the basis of the measured alignment mark positions of the alignment shot region group B, the design values of the shot region array coordinates, and a predetermined model expression.

Step 213:

The main control system 100 judges whether shot regions to be exposed are shot region scan-exposed in the direction +y or shot regions scan-exposed in the direction −y on the basis of the scanning direction (e.g. the direction +y) and the stepping direction (the directions xy) recorded as parameters in the wafer parameter group. If the shot regions concerned are judged to be those which were scan-exposed in the direction +y, the process proceeds to step 214, whereas, if they are judged to be shot regions scan-exposed in the direction −y, the process proceeds to step 215.

Step 214:

The main control system 100 scans the wafer stage WST and the mask stage RST synchronously on the basis of the shot region array coordinates XY (A) calculated at step 212, the scanning direction (the direction +y) and the stepping direction (the directions xy), which have been recorded as parameters in the wafer parameter group, the exposure condition parameters, and the illumination condition parameters, and while doing so, the main control system 100 projects the pattern of the mask R1 onto the shot regions on the wafer W. By repeating the scanning exposure and the stepping of the wafer stage WST, an image of the circuit pattern on the mask R(m) is overlaid on and transferred to each shot region by the step-and-scan exposure method. Because the direction of scanning exposure in the present exposure process has been determined to be the same as the direction of scanning exposure in the preceding exposure process at step 109, scanning exposure is carried out with the scanning direction in the preceding exposure (for the m−1 th layer) coincident with the scanning direction in the present exposure (for the m th layer). Next, the process proceeds to Step 216.

Step 215:

The main control system 100 scans the wafer stage WST and the mask stage RST synchronously on the basis of the shot region array coordinates XY (B) calculated at step 212, the scanning direction (the direction −y) and the stepping direction (the directions xy), which have been recorded as parameters in the wafer parameter group, the exposure condition parameters, and the illumination condition parameters, and while doing so, the main control system 100 projects the pattern of the mask R1 onto the shot regions on the wafer W. By repeating the scanning exposure and the stepping of the wafer stage WST, an image of the circuit pattern on the mask R(m) is overlaid on and transferred to each shot region by the step-and-scan exposure method. That is, scanning exposure is carried out with the scanning direction in the preceding exposure (for the m−1 th layer) coincident with the scanning direction in the present exposure (for the m th layer). Next, the process proceeds to Step 216.

Step 216:

The main control system 100 judges whether or not exposure has been completed with respect to all the shot regions on the wafer W. If it is judged that exposure for all the shot regions has been completed, the process proceeds to step 107, whereas, if exposure for all the shot regions has not yet been completed, the process returns to step 113 to continue the exposure processing.

Thus, in this embodiment, a mechanical tendency peculiar to the system in its exposure operation for, for example, the direction +y has the same effect on the corresponding shot regions in various layers. Therefore, the alignment accuracy of the shot regions and the overlay accuracy of the patterns in each shot region improve. In alignment also, representative alignment points (i.e. alignment shot regions) are determined separately for a group of shot regions scan-exposed in the direction +y (i.e. alignment shot region group A) and for a group of shot regions scan-exposed in the direction −y (i.e. alignment shot region group B). Therefore, there is no alignment error between the shot regions scan-exposed in the direction +y and the shot regions scan-exposed in the direction −y.

It is also conceivable that the rotation, magnification and perpendicularity in each shot region are measured and corrected in order to effect a high level of alignment. In such a case also, measurement and correction should be carried out separately for a group of shot regions scan-exposed in the direction +y and for a group of shot regions scan-exposed in the direction −y, in the same way as in the above-described embodiment. In this case also, for each shot region, the scanning direction in scanning exposure for the circuit pattern in the m th layer is made coincident with the scanning direction in scanning exposure for the circuit pattern in the m−1 th layer.

In alignment for an exposure process in which circuit patterns for different layers are transferred by using the same exposure system (scanning exposure system) in particular, there may be a marked difference in exposure position due to the difference in scanning direction during scanning exposure. However, in a case where exposure for the m th layer and exposure for the m−1 th layer are carried out by respective exposure systems also, mechanical tendencies (e.g. shift of the center of gravity caused by movement of the stage position, etc.) exist as mutual mechanical habits. Therefore, it is possible to improve the alignment accuracy by adopting the scheme in which the scanning direction in scanning exposure for each particular shot region in the m th layer is determined to be the same as the scanning direction in scanning exposure for that shot region in the m−1 th layer so that the mechanical tendencies are kept as they are. Further, it is desirable that the number of shot regions in the alignment shot region group A and that in the alignment shot region group B should be made equal to each other so that there is no difference in alignment accuracy between the alignment shot region group A and the alignment shot region group B. In some shot regions, an alignment error may arise. In such a case, the mark positions in a neighboring shot region selected as a substitute shot region should be measured. As a substitute shot region, a shot region having the same scanning direction as the shot region causing an alignment error is selected (e.g. for the alignment shot region S5, another shot region in the row N2 in FIG. 3 is selected).

Regarding errors in a shot region, the rotational tendency, the magnification, perpendicularity, etc. of the shot region are optimized by the above-described exposure method. Therefore, the total alignment accuracy improves. The present invention is also effective in a case where a multiplicity of alignment marks are provided in each shot region, and a parameter concerning alignment between shot regions is calculated by using information concerning the alignment marks.

When there is no change in the system mechanical tendencies (i.e. when exposure for the m th layer and exposure for the m−1 th layer are carried out by using the same system), the exposure process may be executed as follows: Only the alignment shot region group A is measured, and only shot region array coordinates XY (A) are calculated. Then, exposure is carried out for the shot regions scan-exposed in the direction +y and the shot regions scan-exposed in the direction −y on the basis of the shot region array coordinates XY (A) with the scanning direction for each shot region group made coincident with the scanning direction in the preceding scanning exposure.

Although in the above-described first and second embodiments, parameters concerning the scanning and stepping directions in the file PPF (m) used to carry out exposure for the m th layer are set by copying the parameters concerning the scanning and stepping directions in the file PPF (m−1) used to carry out exposure for the m−1 th layer, it should be noted that the present invention is not necessarily limited to the above. For example, the arrangement may be such that a combination of information concerning each shot region scan-exposed in the direction +y during exposure for the m−1 th layer and information concerning the scanning direction, and another combination of information concerning each shot region scan-exposed in the direction −y and information concerning the scanning direction are stored, together with an identification number (ID number) of the wafer W, in a host computer above the main control system 100 in such a state that the two different kinds of information can be identified. When exposure for the m th layer is to be carried out, the alignment and exposure sequence described in the first or second embodiment is executed on the basis of information concerning the scanning exposure direction with respect to each shot region read out from the host computer, thereby making the scanning direction in the scanning exposure for the m th layer circuit pattern coincident with the scanning direction in the scanning exposure for the m−1 th layer circuit pattern. By obtaining information concerning the scanning exposure direction with respect to each shot region from the host computer, it is possible to readily obtain information concerning the scanning exposure direction in exposure for the m−1 th layer when exposure for the m th layer is to be carried out even in a case where the exposure for the m−1 th layer and the exposure for the m th layer are carried out by using different exposure systems. It should be noted that in a case where exposure for the m−1 th layer and exposure for the m th layer are carried out by using different exposure systems, information concerning the scanning exposure direction in the exposure for the m−1 th layer may be obtained directly from the exposure system used to carry out exposure for the m−1 th layer.

There are various methods by which the exposure system or the host computer checks an exposure history, e.g. a direction in scanning exposure, of each shot region exposed in the m−1 th layer, and holds information concerning which shot region was exposed in which direction. For example, a file containing the record of an exposure sequence is recorded on a hard disk, and a scanning direction in the exposure for shot regions in the preceding layer (i.e. first shot regions with respect to second shot regions) is read out from the hard disk.

It is also possible to adopt a method in which the operator inputs the name of a file for the preceding shot regions which contains the record of the desired data concerning scanning direction, and copies the data concerning scanning direction from this file.

Although in the foregoing first and second embodiments the EGA method is selected as an alignment method, it is also possible to select an alignment method in which the alignment marks in the shot regions S3 and S22 in FIG. 3, for example, are detected, and after rotation correction alone has been made, positioning of each shot region is carried out on the basis of the design values of the shot region array coordinates. In a case where such an alignment method is selected also, the scanning direction in scanning exposure for the m th layer circuit pattern is made coincident with the scanning direction in scanning exposure for the m−1 th layer circuit pattern for each shot region.

In a case where the scanning direction and the stepping direction are not coincident with each other, the scanning direction in scanning exposure for the m th layer circuit pattern is made coincident with the scanning direction in scanning exposure for the m−1 th layer circuit pattern for each shot region, and with respect to the stepping direction also, the stepping direction of the wafer stage WST in exposure for the m th layer circuit pattern is made coincident with the stepping direction of the wafer stage WST in exposure for the m−1 th layer circuit pattern.

In the step-and-repeat method, a plurality of shot regions are formed on the wafer W by repeating exposure and stepping of the wafer stage WST. In this method also, the alignment accuracy is improved by making the stepping direction of the wafer stage WST in exposure for the m th layer circuit pattern coincident with the stepping direction of the wafer stage WST in exposure for the m−1 th layer circuit pattern.

Although in the foregoing the present invention has been described with regard to alignment of two successive layers, i.e. alignment of the m th layer with respect to the m−1 th layer, the scanning direction with which the scanning direction in scanning exposure for the m th layer is made coincident not necessarily limited to the scanning direction in scanning exposure for the m−1 th layer. Data concerning the scanning direction for any desired a th layer (m-a>1) may be used to determine the scanning direction for scanning exposure which is to be carried out. For example, each file PPF is previously stored with the record of information concerning the desired a th layer, and the data concerning the scanning direction for the desired a th layer is copied at step 109 in FIG. 4. Alternatively, the operator may input scanning direction information about the desired a th layer to the main control system 100. It is also possible for the main control system 100 to automatically obtain the desired scanning direction information from the host computer.

Thus, in the present invention, the scanning direction in scanning exposure carried out by using a preceding, first mask pattern and the scanning direction in scanning exposure carried out by using a succeeding, second mask pattern are made coincident with each other. Therefore, alignment accuracy is improved.

What is claimed is:

1. An exposure method comprising the steps of:
   selecting at least two marks from a plurality of marks formed on a substrate by a scanning exposure of a step-and-scan type; and
   calculating an exposure position with respect to a predetermined region on the substrate on the basis of the positional information on the selected at least two marks,
   wherein the at least two marks are selected in consideration of a direction of scanning for scanning exposure carried out when said marks are formed on said substrate.

2. An exposure method according to claim 1, wherein the at least two marks are formed by carrying out scanning exposure in a direction which is the same as the direction of scanning for exposure carried out when said marks are favored.

3. An exposure method according to claim 2, wherein the plurality of marks include at least two first marks formed by scanning exposure in a first direction and at least two second marks formed by scanning exposure in a second direction different from the first direction.

4. An exposure method according to claim 3, wherein the predetermined region includes a plurality of first predetermined regions formed by scanning exposure in the first direction and a plurality of second predetermined regions formed by scanning exposure in the second direction, wherein the exposure position with respect to the first predetermined regions is calculated on the basis of the positional information on the at least two first marks and wherein the exposure position with respect to the second predetermined regions is calculated on the basis of the positional information on the at least two second marks.

5. An exposure method according to claim 4, wherein the first predetermined regions and the second predetermined regions are formed adjacent to each other.

6. An exposure method according to claim 4, wherein the direction and the second direction are parallel and opposite to each other.

7. An exposure method according to claim 3, wherein the first marks to be used for calculation of the exposure position with respect to the first predetermined regions and the second marks to be used for calculation of the exposure position with respect to the second predetermined regions are equal in number.

8. An exposure method according to claim 3, wherein either the at least two first marks or at least two second marks are selected in consideration of a direction of scanning for scanning exposure carried out when said marks are formed on the substrate.

9. An exposure method according to claim 1, wherein the plurality of marks are alignment marks associated with a plurality of shot regions formed by the scanning exposure of the step-and-scan type.

10. An exposure method according to claim 1, wherein the positional information on the at least two marks is stored in association with a direction of scanning for forming the marks on the substrate.

11. An exposure method according to claim 1, wherein said scanning exposure of the step-and-scan type includes a scanning exposure in a first direction and a scanning exposure in a second direction which is different from the first direction.

12. An exposure method according to claim 1, wherein said selected at least two marks are designated through an input device.

13. An exposure method comprising the steps of:
measuring positional information on first marks formed on a substrate by carrying out scanning exposure in a first direction;
measuring positional information on second marks formed on the substrate by carrying out scanning exposure in a second direction different from the first direction;
calculating an average value of the positional information on the first mark and the positional information on the second mark;
calculating an exposure position with respect to a predetermined region on the substrate on the basis of the calculated average values; and
transferring a circuit pattern onto the substrate on the basis of the calculated exposure position.

14. An exposure method according to claim 13, wherein the average values are calculated on the basis of the positional information on the first marks and the positional information on the second marks, each of the first marks and each of the second marks being adjacent to each other.

15. An exposure method comprising the steps of:
measuring positional information on a plurality of marks on a substrate, which are formed by a scanning exposure of a step-and scan type; and
storing the positional information on the plurality of marks and a direction of scanning for forming the marks on the substrate in association with each other.

16. An exposure method according to claim 15, wherein an exposure position with respect to a predetermined region on the substrate is calculated on the basis of the positional information on the marks formed in the same direction of scanning, which is included in the stored positional information on the plurality of marks.

17. An exposure method comprising the step of calculating an exposure position with respect to a shot region on a substrate formed by scanning exposure in a first direction and an exposure with respect to a shot region on the substrate formed by scanning exposure in a second direction different from the first direction, based on either a plurality of first marks formed on the substrate or a plurality of second marks formed on the substrate.

18. An exposure method according to claim 17, where in the plurality of first marks and the plurality of second marks are formed in different regions on the substrate.

19. An exposure method according to claim 18, wherein the plurality of first marks are formed by scanning exposure in the first direction and the plurality of second marks are formed by scanning exposure in the second direction.

20. An exposure method according to claim 19, wherein the first direction and the second direction are parallel and opposite to each other.

21. An exposure method according to claim 17, wherein a pattern is transferred with respect to the shot regions on the basis of the calculated exposure positions.

22. An exposure method according to claim 17, wherein said plurality of second marks are formed on the substrate in a condition which is different from the condition of forming said plurality of first marks.

23. An exposure method according to claim 22, wherein said condition for forming the second marks is a scanning direction for scanning exposure carried out when said first marks and second marks are formed on said substrate.

24. A method for producing a circuit element, comprising the steps of:
selecting at least two marks from a plurality of marks on a substrate, which are formed by a scanning exposure of a step-and-scan type:
calculating an exposure position with respect to a predetermined region on the substrate on the basis of the positional information on the selected at least two marks; and
transferring a pattern of the circuit element onto the substrate on the basis of the calculated exposure position,
wherein the at least two marks are selected in consideration of a direction of scanning for scanning exposure carried out when said marks are formed on said substrate.

25. a method for producing a circuit element, comprising the steps of:
calculating an exposure position with respect to a shot region on a substrate formed by scanning exposure in a first direction and an exposure position with respect to a shot region on the substrate formed by scanning exposure in a second direction different from the first direction, based on either a plurality of first marks formed on the substrate or a plurality of second marked formed on the substrate; and
transferring a pattern of the circuit element onto the substrate on the basis of the calculated exposure positions.

26. A method according to claim 25, wherein said plurality of second marks are formed on the substrate in the condition which is different from the condition of forming said plurality of first marks.

27. A method according to claim 26, wherein said condition for forming the first and second marks is a scanning direction for scanning exposure carried out when said first marks and second marks are formed on said substrate.

28. An exposure method comprising the steps of:
forming a plurality of marks on a substrate by exposure action, said exposure action including a scanning exposure in the first direction and a scanning exposure in the second direction which is different from the first direction;
selecting at least two marks from the plurality of marks, which are formed by the scanning exposure in the same direction carried out when said marks are formed; and controlling a position of a stage on the basis of the positional information on the selected at least two marks, said stage moving with supporting said substrate.

29. An exposure method according to claim 28, wherein said plurality of marks are alignment marks, said alignment marks being accompanied with a plurality of shot areas which are formed by said exposure action.

30. An exposure method according to claim 29, further comprising the steps of:

calculating exposure positions with respect to said plurality of shot areas on the basis of the positional information on the at least two marks; and controlling the position of said stage in accordance with said calculated exposure positions.

31. An exposure method according to claim 28, wherein said at least two marks are selected on the basis of designation through an input device.

* * * * *